(12) United States Patent
Ohshima

(10) Patent No.: US 6,356,138 B1
(45) Date of Patent: Mar. 12, 2002

(54) SWITCHING DEVICE WITH BREAK DETECTING FUNCTION

(75) Inventor: Shunzou Ohshima, Shizuoka-ken (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/502,009

(22) Filed: Feb. 11, 2000

(30) Foreign Application Priority Data

Feb. 14, 1999 (JP) .............................................. 11-74258
Feb. 9, 2000 (JP) ........................................ 2000-32359

(51) Int. Cl.[7] .......................................... H03K 17/687
(52) U.S. Cl. ....................... 327/434; 327/378; 327/389; 327/108; 323/282; 307/125
(58) Field of Search ................................ 327/378, 375, 327/383, 385, 432, 427, 434, 525, 538, 540, 541, 108; 307/125, 131; 361/53.1, 57, 87; 323/282, 289; 315/291, 224, 226, 228, 230

(56) References Cited

U.S. PATENT DOCUMENTS

| | | | | |
|---|---|---|---|---|
| 4,104,546 A | * | 8/1978 | Seiler ......................... | 327/525 |
| 4,553,084 A | * | 11/1985 | Wrathall ..................... | 330/257 |
| 4,894,587 A | | 1/1990 | Jungreis et al. ............. | 315/219 |
| 5,220,207 A | * | 6/1993 | Kovalcik et al. ............ | 327/432 |
| 5,361,008 A | * | 11/1994 | Saijo ........................... | 327/427 |
| 5,371,419 A | * | 12/1994 | Sundby ....................... | 327/389 |
| 5,408,694 A | * | 4/1995 | Tran ............................. | 327/72 |
| 5,473,276 A | * | 12/1995 | Throngnumchai .......... | 327/432 |
| 5,654,666 A | * | 8/1997 | Taga et al. ................... | 327/378 |
| 5,903,422 A | * | 5/1999 | Hosokawa ................... | 327/427 |
| 6,081,075 A | * | 6/2000 | Littlefield .................... | 315/224 |
| 6,140,806 A | * | 10/2000 | Gohara ........................ | 323/282 |
| 6,222,355 B1 | * | 4/2001 | Ohshima et al. ............ | 323/282 |
| 6,229,355 B1 | * | 5/2001 | Ogasawara .................. | 327/108 |

FOREIGN PATENT DOCUMENTS

| | | |
|---|---|---|
| DE | 3608362 | 9/1987 |
| EP | 0208083 | 1/1987 |
| JP | 1-227520 | 9/1989 |
| JP | 2-266836 | 10/1990 |
| JP | 3-262209 | 11/1991 |
| JP | 4-134271 | 5/1992 |
| JP | 5-52880 | 3/1993 |
| JP | 6-27157 | 2/1994 |
| JP | 6-61432 | 3/1994 |
| JP | 6-188704 | 7/1994 |
| JP | 6-244693 | 9/1994 |
| JP | 9-145749 | 6/1997 |

\* cited by examiner

Primary Examiner—Toan Tran
Assistant Examiner—Long Nguyen
(74) Attorney, Agent, or Firm—Finnegan, Henderson, Farabow, Garrett & Dunner, L.L.P.

(57) ABSTRACT

A semiconductor switching device has a first semiconductor element, a second semiconductor element, and a comparator. The first semiconductor element has a first main electrode, a second main electrode, and a control electrode. The second semiconductor element has a first main electrode connected to the first main electrode of the first semiconductor element, a control electrode connected to the control electrode of the fist semiconductor element, and a second main electrode connected to a circuit that consists of a resistor and a constant current source that are connected in parallel with each other. The comparator compares potentials of the second main electrodes of the first and second semiconductor elements with each other. If the potential of the second main electrode of the first semiconductor element exceeds the potential of the second main electrode of the second semiconductor element, it is determined that there is a break in the load. The switching device is capable of detecting a current in a power line without a shunt resistor connected in series to the power line, thereby minimizing a heat loss.

6 Claims, 3 Drawing Sheets

SWITCHING DEVICE WITH BREAK DETECTING FUNCTION

CROSS REFERENCE TO RELATED APPLICATIONS

The subject application claims benefit of the earlier filing dates of Japanese Patent Application Nos.Hei 11-74258 and 2000-32359 filed on Feb. 14, 1999 and Feb. 9, 2000 under the Paris Convention, the entire contents of which are incorporated by reference herein.

BACKGROUND OF THE INVENTION

1. Field of the Invention

The present invention relates to a switching device provided with a function for detecting a break in a load of lights.

2. Description of the Related Art

FIG. 1 shows a switching device according to a prior art used for a load such as a lamp, having a function for detecting a break in the load. The switching device has an element (an FET in this example) QF for controlling the supply of power from a power source such as a battery of an automobile to a load such as a lamp, The power source 101 provides an output voltage VB. The power source 101 is connected to an end of a shunt resistor RS. The other end of the shunt resistor RS is connected to a drain D of the element QF. A source S of the element QF is connected to the load 102. A driver 901 detects a current flowing through the shunt resistor RS and drives the element QF accordingly. An A/D converter 902 and a microcomputer (CPU) 903 receive a curre.nt value detected by the driver 901, and according to the current value, determine whether or not an overcurrent is flowing to the element QF and whether or not the load 102 involves a break. The element QF may have a temperature sensor to achieve an overheat breaking function.

A zener diode ZD1 keeps a voltage of 12 V between the gate G and source S of the element QF, to bypass an overvoltage so that the overvoltage may not be applied to the gate of the element QF. The driver 901 includes differential amplifiers 911 and 913 serving as a current monitor circuit, a differential amplifier 912 serving as a current limiter, a charge pump 915, and a driver 914. The driver 914 receives an ON/OFF control signal from the microcomputer 903 and an overcurrent signal from the current limiter and drives the gate of the element QF through an internal resistor RG (not shown). A voltage drop occurring at the shunt resistor RS is detected by the microcomputer 903 through the differential amplifiers 911 and 913 and A/D converter 902. If the voltage drop is above a normal level corresponding to a normal current value, the microcomputer 903 determines an overcurrent, and if it is below the normal level, the microcomputer 903 determines a break in the load 102.

This prior art must have the shunt resistor RS connected in series to a power line, to detent a current in the power line. The shunt resistor RS causes a large heat loss if a current passing through the power line is large.

The shunt resistor RS, A/D converter 902, microcomputer 903, etc., that are imperative for the prior art require a large space and are expensive, thereby increasing the size and cost of the switching device.

SUMMARY OF THE INVENTION

An object of the present invention is to provide a semiconductor switching device that is easy to integrate, inexpensive, and capable of detecting a current in a power line without a shunt resistor connected to the power line, minimizing a heat loss, and detecting a break in a load such as a lamp.

In order to accomplish the objects, an aspect of the present invention provides a semiconductor switching device having a first semiconductor element, a second semiconductor element, and a comparator. The first semiconductor element has a first main electrode, a second main electrode, and a control electrode. This second main electrode is connected to lamps serving as a load. The second semiconductor element has a first main electrode connected to the first main electrode of the first semiconductor element, a control electrode connected to the control electrode of the first semiconductor element, and a second main electrode connected to a circuit that is composed of a resistor and a constant current source that are connected in parallel with each other. The comparator compares potentials of the second main electrodes of the first and second semiconductor elements with each other. If the potential of the second main electrode of the first semiconductor element is higher than the potential of the second main electrode of the second semiconductor element, it is determined that there is a break in the lamps. The first and second semiconductor elements may be FETS, SITs (static induction transistors), or BJTs (bipolar junction transistors). Alternatively, the first and second semiconductor elements may be MOS composite elements such as ESTs (emitter switched thyristors) and MCTs (MOS controlled thyristors), or insulated gate power elements such as IGBTs. These elements may be any one of n- and p-channel types. The first main electrode is one of the emitter and collector electrodes of a BJT or an IGBT, or one of the source and drain electrodes of an IGFET such as a MOSFET and MOSSIT. The second main electrode is the other of the emitter and collector electrodes of the BJT or IGBT, or the other of the source and drain electrodes of the IGFET. If the first main electrode is an emitter electrode, the second main electrode is a collector electrode. If the first main electrode is a source electrode. the second main electrode is a drain electrode. The control electrode is a base electrode of the BJT, or a gate electrode of the IGBT or IGFET.

According to the aspect, a resistance value of the resistor and a current value of the constant current source are set such that the potential difference between the second main electrodes of the first and second semiconductor elements will be zero if a current flowing through the first semiconductor element has an intermediate value between a normal current value and a break current value.

A break in the lamps is detected according to the value of a current passing through the lamps. The intermediate current value between a normal current value and a break current value is IDAS, which is used as a break reference value. If the first semiconductor element is a power MOSFET, a terminal voltage (drain-source voltage) of the power MOSFET is expressed as "RonA×IDA" where RonA is, the ON resistance of the power MOSFET and IDA is a drain current thereof. Similarly, a terminal voltage of the second semiconductor element is expressed as "RonB×IDB" where RonB is the ON resistance of the second semiconductor element and IDB is a drain current thereof. The drains of the first and second semiconductor elements are connected to each other, and the gates thereof are also connected to each other. When the break reference current IDAS is flowing to the first semiconductor element, the current value IDB of the second semiconductor element is so set as to zero the potential difference between the sources (the second main electrodes) of the first and second semiconductor elements, and the following is established:

$$RonB \times IDB = RonA \times IDA \qquad (1)$$

If the lamps have no break, the following is established:

$$RonA \times IDA > RonB \times IDB \quad (2)$$

If the lamps have a break, the following is established:

$$RonA \times IDA < RonB \times IDB \quad (3)$$

Namely, the potential difference between the sources (the second main electrodes) of the first and second semiconductor elements is indicative of a break in the lamps.

The drain current IDB is expressed as follows:

$$IDB = (RonA/RonB)IDAS \quad (4)$$

The break reference current IDAS changes according to a power source voltage. As the power source voltage increases, the break reference current IDAS increases. However, as the source voltage increases, the temperature of lamp filaments increases to increase the resistance of the lamp filaments, and therefore, the break reference current IDAS is not simply proportional to the. power source voltage. To realize IDB that satisfies the expression (4), the circuit composed of the resistor and constant current source that are connected in parallel with each other is inserted between the source of the second semiconductor element and the ground.

According to the aspect, the first and second semiconductor elements, comparator, and constant current source may be integrated on a semiconductor chip. The driver may also be integrated on the semiconductor chip, to form a monolithic power IC that is small and light. The monolithic structure minimizes electric characteristic differences between the first and second semiconductor elements.

Each of the first and second semiconductor elements may be formed of FETs that have identical characteristics and are connected in parallel with one another. The number of FETs that form the first semiconductor element may be larger than that of FETs that form the second semiconductor element.

Forming each of the first and second semiconductor elements with FETs that have identical characteristics and are connected in parallel with one another will be explained Each FET has an ON resistance of Rfet. The number of FETs of the first semiconductor element is N1, and that of the second semiconductor element is N2. The ON resistance values RonA and RonB of the first and second semiconductor elements are as follows:

$$RonA = Rfet/N1 \quad (5)$$

$$RonB = Rfet/N2 \quad (6)$$

According to the expressions (4), (5), and (6), the following is obtained:

$$IDB = (N2/N1)IDAS \ldots (7)$$

In this way, IDB and IDAS are related to each other only with the ratio of the numbers of FETs and become irrelevant to Rfet. Namely, IDB and IDAS are free from a temperature drift in Rfet or variations in manufacturing lots. This results in improving the correctness of break determination. Since N1>N2, IDB<IDA As a result, the switching device of the present invention is capable of detecting a current in a power line without a shunt resistor connected in series to the power line, thereby minimizing a heat loss. In addition, the switching device of the present invention needs no microcomputer, thereby reducing the space and cost thereof.

The first semiconductor element may be a power element having a multi-channel structure consisting of parallel-connected unit cells (transistor cells). The numbers of unit cells of the first and second semiconductor elements are adjusted so that the current capacity of the first semiconductor element will be greater than that of the second semiconductor element. The numbers of unit cells determine a current dividing ratio of the first and second semiconductor elements. For example, the second semiconductor element may be made of one unit cell, and the first semiconductor element of 1000 unit cells. In this case, the ratio of the channel width of the second semiconductor element to that of the first semiconductor element is 1:1000, which determines a current dividing ratio. This arrangement enables the second semiconductor element to be small.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

DESCRIPTION OF THE PREFERRED EMBODIMENTS

Figure 1:
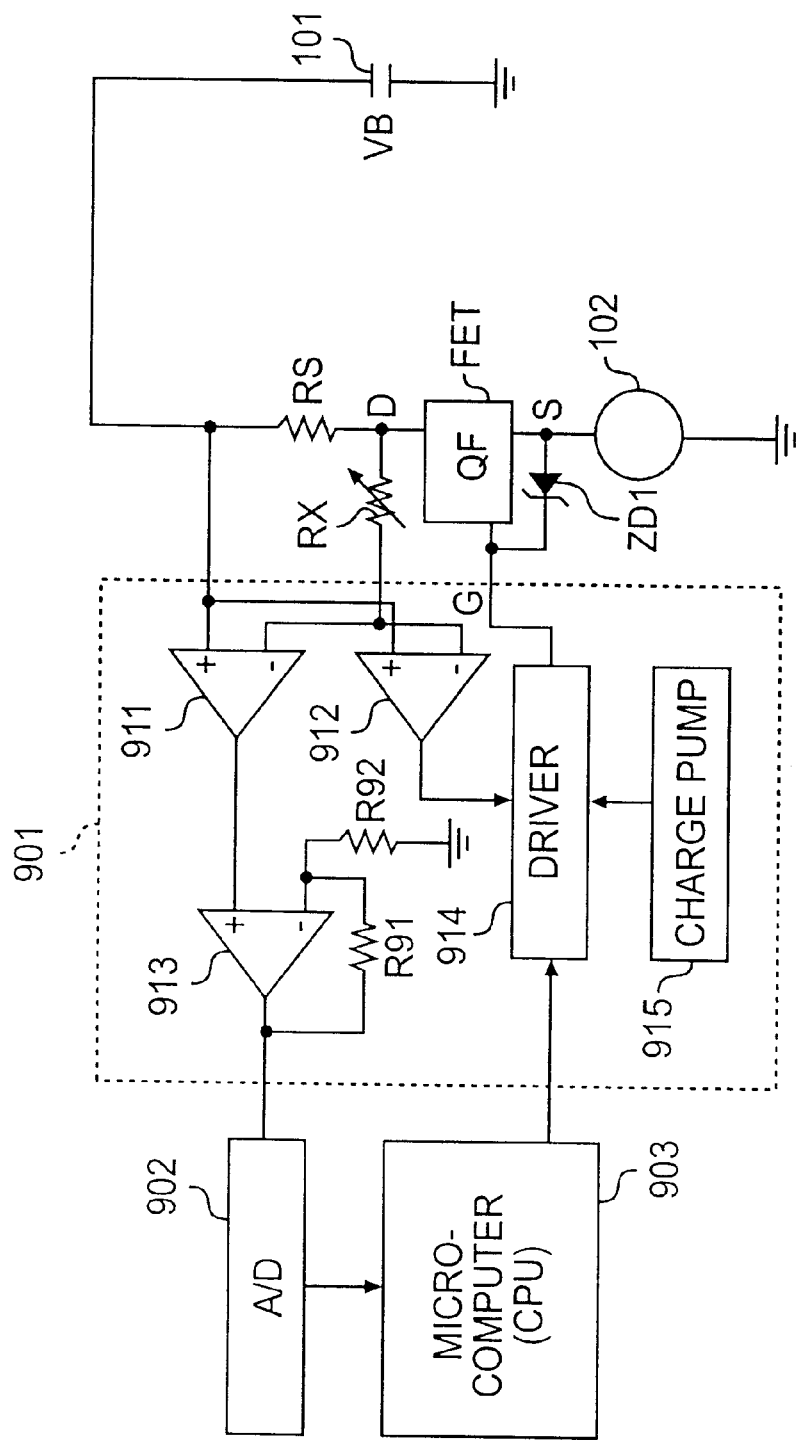
FIG. 1 is a circuit diagram showing a semiconductor switching device according to a prior art.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Figure 2:
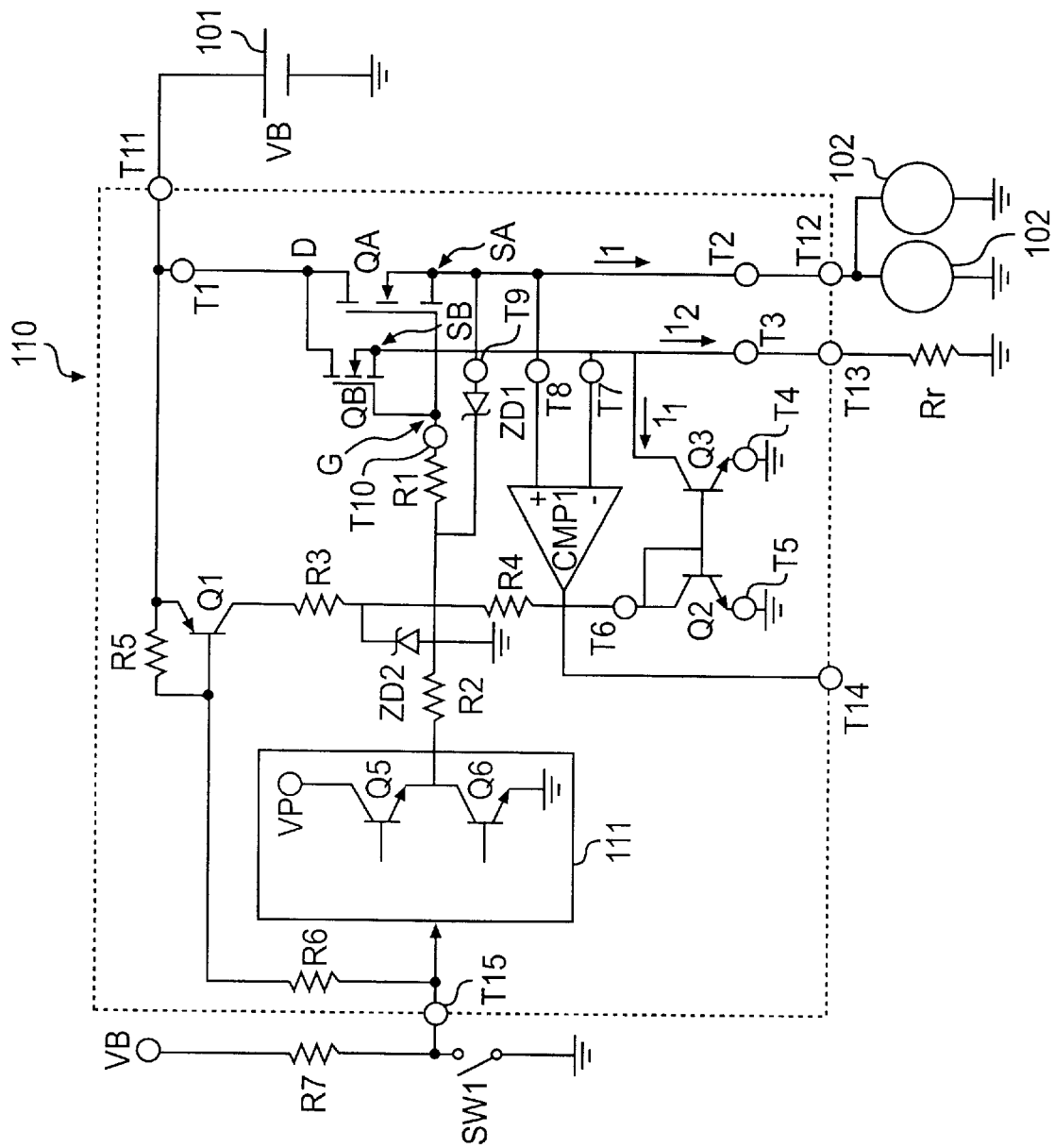
FIG. 2 is a circuit diagram showing a semiconductor switching device having a break detecting function according to an embodiment of the present invention.

FIG. 2 is a circuit diagram showing a semiconductor switching device having a break detecting function according to an embodiment of the present invention. The switching device has a first semiconductor element QA serving as a main power element and a controller. The controller detects a change in a current flowing through the first element QA, determines a break in the lamps, and provides a break-detected signal. The first element QA and controller are integrated on a single substrate. The substrate may be an insulating substrate made of ceramics or glass epoxy, or an insulating metal substrate. The switching device of the present invention may be in the form of a hybrid IC, or preferably, a monolithic power IC.

The switching device is arranged between a power source 101 for supplying a voltage of VB and a load 102, which consists of two lamps in this example; The first element QA is, for example, an n-channel power MOSFET. The first element QA consists of N1 pieces of FETs that have identical characteristics and are connected in parallel with one another. The first element QA has a first main electrode (drain), a second main electrode (source), and a control electrode (gate).

The switching device has a second semiconductor element QB. The second element QB consists of N2 pieces of FETs whose characteristics are the same as those of the PETs that form the first element QA. The N2 FETs of the second element QB are connected in parallel with one another. The second element QB has a first main electrode (drain), a second main electrode (source), and a control electrode (gate). The drains of the first and second elements QA and QB are connected to each other, and the gates thereof are also connected to each other. An area 110 surrounded with a dotted line in FIG. 2 defines a power IC 110. The power IC 110 further includes a comparator CMP1 for comparing source potentials of the first and second elements QA and QB with each other, an output terminal T14 for providing the output of the comparator CMP1 to the outside, a driver 111 for supplying a control voltage to the gates of the first and second elements QA and QB, and a constant current source. A resistor Rr is arranged outside the power IC 110 between the source of the second element QB and the ground. This arrangement secures the resistance of the resistor Rr and enables a break reference value to easily be changed.

The first element QA, second element QB, transistors Q1 to Q3, Q5, and Q6, resistors R1 to R7, zener diodes ZD1 and ZD2, comparator CMP1, and driver 111 are monolithically integrated. on a semiconductor chip to form the power IC 110. The zener diode ZD1 keeps a voltage of 12 V between the gate and source of the first element QA, to bypass an overvoltage so that the overvoltage may not be applied to the gate of the first element QA. Outside the semiconductor chip 110, there are the resistor Rr and a switch SW1, which is closed by a user to start the switching device of the present invention.

The driver 111 for supplying a control voltage to the gates of the first and second elements QA and QB has the source transistor Q5 whose collector is connected to a charge-pump output voltage VP, and the sink transistor Q6 whose emitter is connected to the ground. The transistors Q5 and Q6 are turned on and off in response to an ON/OFF signal from the switch SW1, to provide a control voltage to the control electrodes of the first and second elements QA and QB. The output voltage VB from the power source 101 is, for example, 12 V, and the charge-pump output voltage VP is, for example, VB+10 V.

The constant current source is connected to the source of the second element QB and consists of the transistors Q1 to Q3, resistors R3 to R5, and zener diode ZD2. AE when the switch SW1 is closed, the transistor Q1 becomes conductive, and the following is established:

$$IC2=\{VZD2-0.3\ V\}/R4 \quad (8)$$

where VZD2 is a zener voltage of the zener diode ZD2, IC2 is a collector current of the transistor Q2, and 0.3 V is an ON voltage of the transistor Q2.

If a current amplification ratio (hfe) achieved by the transistors Q2 and Q3 is large, a collector current I1 of the transistor Q3 will substantially be equal to the collector current IC2 of the transistor Q2 as follows:

$$I1=IC2=\{VZD2-0.3\ V\}/R4 \quad (9)$$

where 0.3 V is the ON voltage of the transistor Q2. Consequently, the collector current I1 of the transistor Q3 is a constant current independent of a source voltage and is set to a required value by properly selecting VZD2 and R4.

Figure 3A:
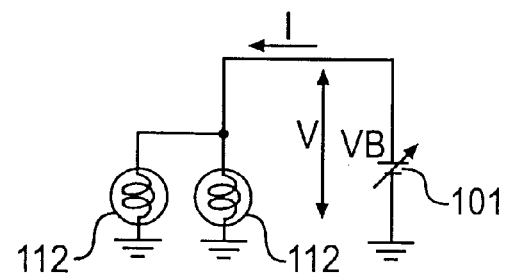
FIG. 3A shows a circuit for obtaining an I-V curve of parallel-connected lamps.
Figure 3B:
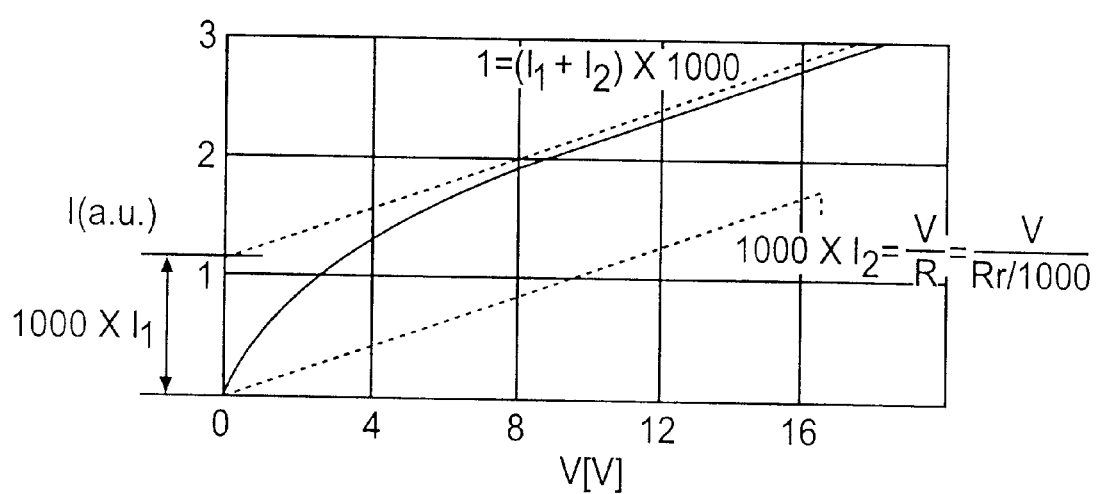
FIG. 3B is a graph showing the principle of correctly detecting a break according to the I-V curve of the lamps.

FIGS. 3A and 3B show the principle of the present. invention of correctly detecting a break in lamps serving as a load, in which FIG. 3A shows a circuit consisting of the lamps 112 and a power source 101 and FIG. 3B shows an I-V curve of the lamps 112. A continuous curve in FIG. 3B represents an actual I-V curve of the lamps 112. This curve is approximated with a straight line if a power source voltage VB provided by the power source 101 is in the range of 8 V to 16 V. The approximated line is defined as the sum of a source-voltage component and a constant-current component. The source-voltage component determines an inclination R of the approximated line. If the current capacity of the second element QB is set to be 1/1000 of that of the first element QA, the reference resistor Rr of FIG. 2 is set to be "1000×R." The constant-current component is a current value at an intersection between the approximated line and an ordinate. The current I1 of FIG. 2 is set to be one thousandth of the intersectional current value by adjusting the resistance values of the resistance R4, etc.

By setting the reference resistor Rr and the current I1, the second element QB may generate a drain-source voltage $V_{DS}$ that is equal to a voltage produced by the first element QA with respect to a normal load current. As a result, a break is correctly detectable in the range of 8 V to 16 V where the approximation is established. Namely, a break among the parallel-connected lamps 112 is detectable. Since the voltage range in which the approximation is established is wide, the present invention is capable of detecting a break in the lamps even if the source voltage VB varies due to the individual characteristics or aging of the lamps. The present invention is also capable of detecting a break even if the lamps are luminosity adjustable lamps that adjust luminosity by adjusting voltage, without adjusting the apparatus of the present invention to the adjusted voltage.

In summary, the switching device of the present invention is capable of detecting a current in a power line without a shunt resistor in the power line, thereby minimizing a heat loss, improving the integration of the switching device, and reducing the cost thereof.

The present invention reduces the current capacity of the second semiconductor element of the switching device less than that of the first semiconductor element thereof, thereby reducing the size of the second semiconductor element and peripheral circuits thereof, to reduce the size and cost of the switching device.

The present invention compares potentials of the second main electrodes (sources) of the first and second semiconductor elements and detects a weak current corresponding to a break in lamps. This technique is free from the ON resistance of the first and second semiconductor elements. Accordingly, the present invention correctly detects a break irrelevant to a temperature drift that may change the ON resistance of the first and second semiconductor elements, or product variations due to lot differences. Unlike the prior art that must adjust a circuit constant product by product to detect a break in small-current lamps, the switching device of the present invention needs no such adjustment, thereby reducing the cost of the switching device.

What is claimed is:
1. A switching device comprising:
    a first semiconductor element including a first electrode, a second electrode connected to a load, and a first control electrode;
    a second semiconductor element including a third electrode connected to the first electrode of the first semiconductor element, a fourth electrode, and a second control electrode connected to the first control electrode of the first semiconductor element;
    a circuit connected to the fourth electrode of the second semiconductor element, wherein the circuit includes a resistor connected in parallel to a constant current source; and
    a comparator for determining a first potential at the second electrode and a second potential at the fourth electrode, outputting a first signal indicating that a break has not occurred in the load when the first potential is less than the second potential, and outputting a second signal indicating that a break has occurred in the load when the first potential exceeds the second potential.

2. The switching device of claim 1 wherein the first and second semiconductor elements, the comparator, and the constant current source are integrated on a semiconductor substrate.

3. The switching device of claim 1, wherein the resistor and the constant current source of the circuit are set to equalize the first potential and the second potential.

4. The switching device of 1 claim wherein:
the first semiconductor element is formed having a first resistance value when turned on; and
the second semiconductor element is formed having a second resistance value when turned on, wherein the second resistance value is greater than the first resistance value.

5. The switching device of claim 4, wherein:
a current flowing through the circuit is a fraction of a current flowing through the load.

6. The switching device of claim 1, further comprising:
a driver for driving the first semiconductor element and second semiconductor element.

* * * * *